(12) United States Patent
Seymour et al.

(10) Patent No.: US 11,622,462 B2
(45) Date of Patent: Apr. 4, 2023

(54) STACKABLE HOUSING BLOCK

(71) Applicants: Arthur F. Seymour, Buffalo Grove, IL (US); James P. Seymour, Buffalo Grove, IL (US); Brian P. Johnson, Buffalo Grove, IL (US)

(72) Inventors: Arthur F. Seymour, Buffalo Grove, IL (US); James P. Seymour, Buffalo Grove, IL (US); Brian P. Johnson, Buffalo Grove, IL (US)

(73) Assignee: E-Blox Inc., Buffalo Grove, IL (US)

( * ) Notice: Subject to any disclaimer, the term of this patent is extended or adjusted under 35 U.S.C. 154(b) by 91 days.

(21) Appl. No.: 17/412,722

(22) Filed: Aug. 26, 2021

(65) Prior Publication Data

US 2022/0104378 A1    Mar. 31, 2022

Related U.S. Application Data

(60) Provisional application No. 63/084,652, filed on Sep. 29, 2020.

(51) Int. Cl.
| | |
|---|---|
| H05K 5/02 | (2006.01) |
| H05K 7/02 | (2006.01) |
| F21V 23/00 | (2015.01) |
| F21V 9/30 | (2018.01) |

(52) U.S. Cl.
CPC .......... *H05K 7/023* (2013.01); *H05K 5/0247* (2013.01); *F21V 9/30* (2018.02); *F21V 23/001* (2013.01)

(58) Field of Classification Search
USPC ......................................................... 361/807
See application file for complete search history.

(56) References Cited

U.S. PATENT DOCUMENTS

| | | | | |
|---|---|---|---|---|
| 5,909,357 A | * | 6/1999 | Orr ........................... | G06F 1/16 361/679.6 |
| 2008/0166926 A1 | * | 7/2008 | Seymour ................... | E04B 2/06 439/701 |
| 2014/0349544 A1 | * | 11/2014 | Chien ................... | A63H 33/042 446/91 |
| 2019/0165527 A1 | * | 5/2019 | Lin .......................... | B60M 1/18 191/39 |

\* cited by examiner

*Primary Examiner* — Hung S. Bui
(74) *Attorney, Agent, or Firm* — Justin Lampel (57) ABSTRACT

An electro-mechanical housing for forming electronic components' wire leads to make plug-together parts or building blocks using only the wire leads of the electronic components to make electronic circuits incorporated in the mechanical structures. A reusable electro-mechanical plug that has means for attaching external devices to the plug-together parts or building blocks using only the wire leads from these external devices and a non-conductive housing to form an electro-mechanical plug.

17 Claims, 14 Drawing Sheets

STACKABLE HOUSING BLOCK

CROSS-REFERENCE TO RELATED APPLICATIONS

This application claims priority to U.S. Provisional Application No. 63/084,652, which is titled "STACKABLE HOUSING BLOCK" which was filed on Sep. 29, 2020, the entire contents of which are incorporated by reference herein.

FIELD OF THE INVENTION

Provided is a three-dimensional electro-mechanical Stackable Housing Or Plug Block (hereafter "SHOP Block") for electronic components that is mechanically stackable and produces electrical contacts as an integral part of a mechanical structure. The electro-mechanical SHOP Block relates specifically to mechanical structures that easily and quickly connect mechanically together and simultaneously provide contacts to the leads of the SHOP Block below, above, or along its side. A SHOP Block containing a two-lead electronic component requires no other parts to make all contacts.

When the present SHOP Blocks are directly vertically stacked, the electronic components inside become electronically connected in parallel. When SHOP Blocks are staggered while stacked, the electronic components inside each block become electronically connected in series. A modified SHOP Block (called SHOPX Block) is also provided such that when SHOPX Blocks are placed side-by-side, the electronic components inside become electronically connected in series with its adjacent block. A SHOP Block may be used as a plug for an external electronic component and requires no other parts other than the leads from the external electronic component to make all contacts. The stacking of SHOP Blocks produces electronic series and parallel connections for all the components inside or externally connected by leads from the outside of the SHOP Block.

BACKGROUND OF THE INVENTION

There are devices and connection methods today for creating electronic blocks wherein a first electronic block has leads which connect with and accept the leads of a second electronic block. One such connection method is to use springs that can hold leads from different components and electronically connect them at the same time. Springs are mounted on a base wherein the springs allows electrical circuits to be built around the springs. The base is usually very large compared to the components of the unit and generally not suitable for the construction of three-dimensional structures.

There are also electronic breadboards that accept leads from electronic components and use clips to connect them to the leads of other electronic components. An example of this type of circuit construction is shown in U.S. Pat. No. 6,459,587 to Chan, which provides a breadboard for building circuits. This breadboard allows electronic components to easily be connected in parallel by use of conductive clips mounted in a non-conductive holder. This type of construction does not allow for three-dimensional paths of electricity without additional breadboards or circuit boards. U.S. Pat. No. 8,221,182 to Seymour describes a system that uses both conductive and non-conductive quick connect or stackable parts to form three-dimensional mechanical structures. In this system, the conductive parts are used to form electronic paths through the mechanical structure, and the non-conductive parts are used to insulate and prevent shorts in the structure. This system has limitations in that the conductive components are conductive at every point (top side and bottom) and not just at the electro-mechanical connection/interference fit points. Non-conductive parts are required to insulate conductive parts in this system, whereas this is not needed in the current electrical blocks and system.

SUMMARY OF THE INVENTION

Most electronic components are connected using two or more wire leads which allow an electrical current to flow through the device. These wire leads are usually very close in diameter to fit into printed circuit boards with punched or drilled holes for soldering. The wire leads are often made of soft iron, plated with tin, to prevent corrosion and are easy to bend and retain new shapes. An electronic component package in which the wire leads for connection come from the same side of the component is known as radial lead construction. An electronic component package in which the wire leads for connection come from opposite sides of the component is known as axial lead construction.

A Light Emitting Diode, or LED, mostly uses radial wire lead construction. Many other electronic components such as capacitors, thermal fuses, crystals, and photocells, just to name a few, also may use radial wire lead construction. Resistors and diodes mostly use axial wire lead construction. By bending the wire leads on these parts, they can be mounted exactly like parts with radial-constructed wire leads. Two wire leads may connect speakers and batteries to printed circuit boards.

By placing radial, wire, or bent axial wire leads into the present SHOP Block and properly forming them, the electronic component can be made stackable and electronically connectable without any other external or internal devices. The SHOP Block performs circuit connection by just pressing a SHOP Block on top of another SHOP Block. One such use of this SHOP Block is to have conductive quick-connect stackable parts that can form three-dimensional mechanical structures that produce light. The conductive leads of an LED are used to form vertical electronic paths through the SHOP Block vertical structure being built. The structure may have, but it is not required, an additional power source grid to provide power to the bottom SHOP Block in the structure while also providing a portable building area.

DETAILED DESCRIPTION OF THE PREFERRED EMBODIMENT

Figure 1:
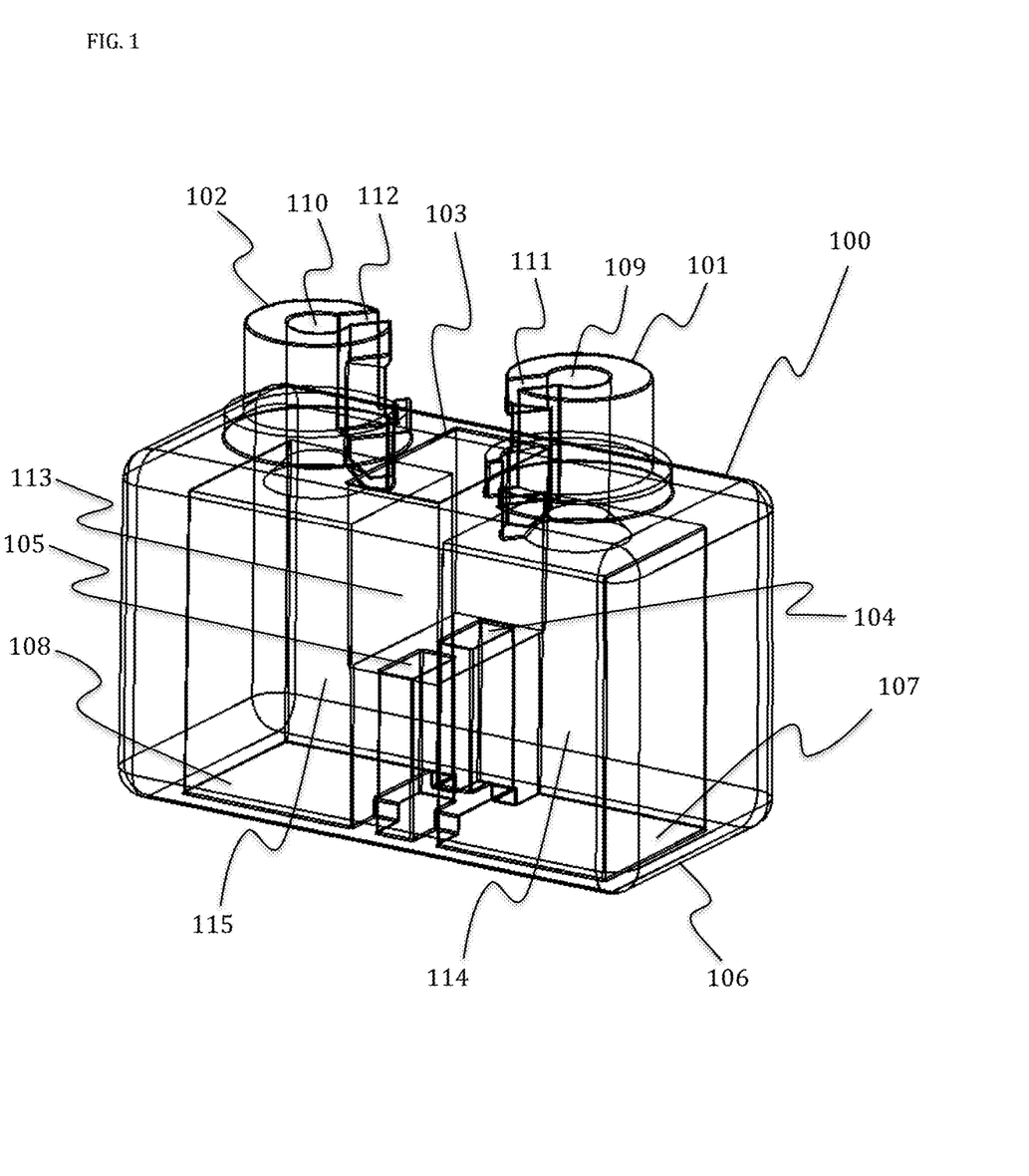
FIG. 1 illustrates a perspective view, in one embodiment, of an empty SHOP Block housing 100 with no electrical components located within the interior.

FIG. 1 shows, in one embodiment, a non-conductive SHOP Block 100 of the present system wherein the present SHOP Block 100 has a right top post 101 and a left top post 102 for wrapping electronic component wire leads. The top of the present SHOP Block may have an opening 103 that allows access to the interior of the SHOP Block 100. The opening 103 may allow the insertion of an electronic component such as an LED unit 500 (FIG. 3) having long radial wire leads 501, 502. Upon insertion of the LED unit 500, the right radial wire lead 501 may pass through an opening 104 of an interior compartment 113 of the SHOP Block 100 and the left radial wire lead 502 would pass through a second opening 105 of an interior compartment 113 of the SHOP Block 100. The interior compartment 113 may be an upward extension compartment located within the interior of the main SHOP Block 100 housing. The interior compartment may extend from the bottom of the SHOP Block 100 and may be a smaller, generally rectangular-shaped interior compartment.

In an embodiment, the SHOP Block 100 is transparent to allow the passing of light from within the interior of the housing to the exterior of the housing. In an embodiment, the SHOP Block 100 may be made of a fluorescent material which allows the block 100 to glow in the dark.

After insertion of the LED 500, wire leads 501, 502 may then extend down toward the bottom 106 of the SHOP Block 100. In an embodiment, the right LED wire lead 501 may be bent backwards and therein inserted back into the interior 114 of the SHOP Block 100 through opening 107 and may come out the top of the SHOP Block through opening 109.

The right LED wire lead 501 may then be bent through slot 111 and wrapped [preferably, counterclockwise] around the top post 101 of the SHOP Block 100. In the preferred method of creating the present block, the next step is to insert the end of the right LED wire lead 501 back into slot 111 and push it down into SHOP Block 100 through opening 109. In a similar manner, the left LED wire lead 502 can be bent and inserted back into the SHOP Block 100 interior 115 through opening 108 and come out the top of the SHOP Block through opening 110. The left LED wire lead 502 is then bent through slot 112 and wrapped [preferably, counterclockwise] around top post 102. The next step is to insert the end of the left LED wire lead 502 back into slot 112 and push it down into SHOP Block 100 through opening 110.

Figure 2:
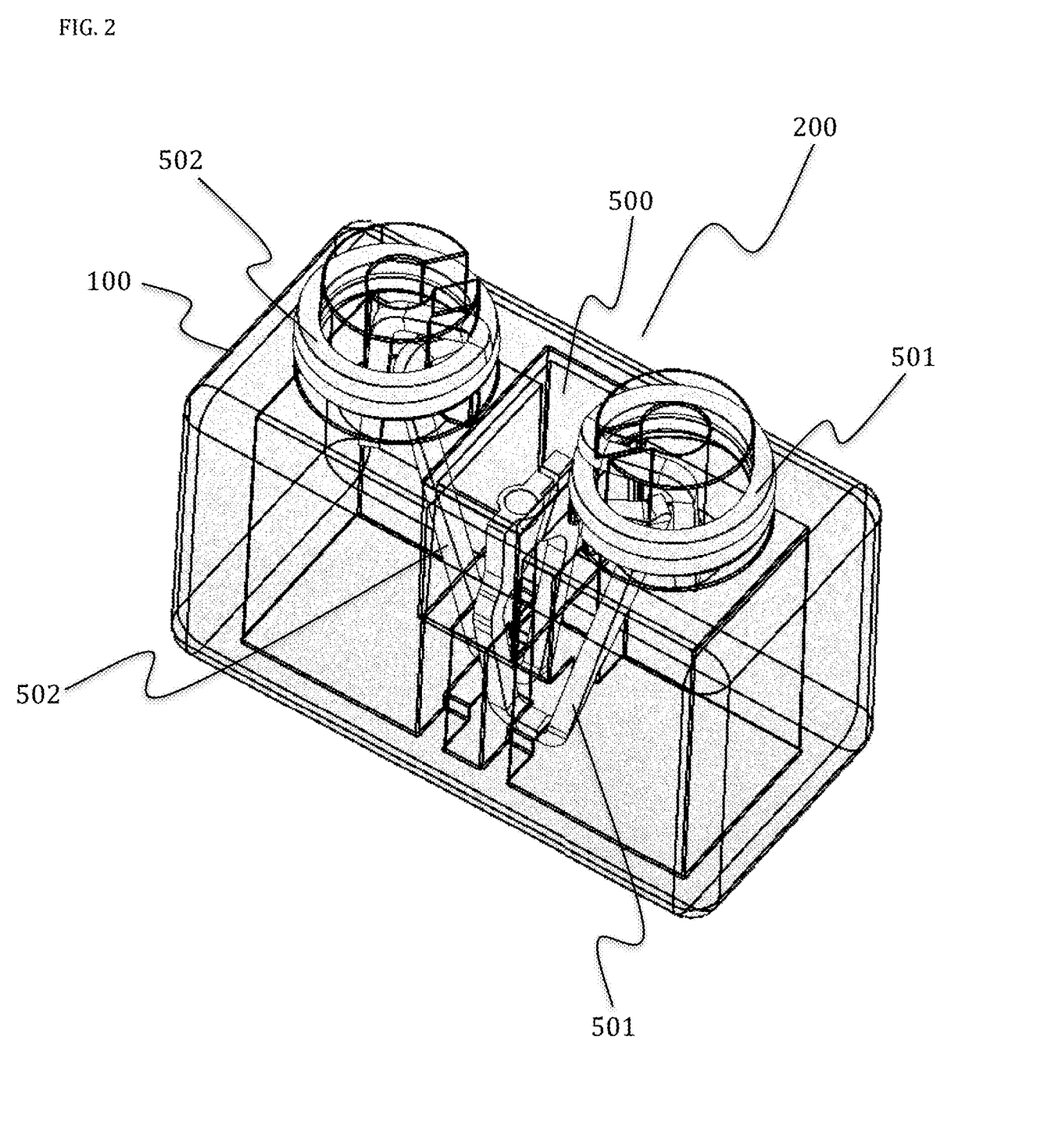
FIG. 2 illustrates a perspective view of an assembled SHOP Block 100 with an LED 500 inside.

FIG. 2 shows a perspective view 200 of the SHOP Block 100 with an LED 500 installed and the LED wire leads 501, 502 formed as described above in one embodiment. There are many different bricks that are designed to mechanically stack and build structures by placing top posts similar to the top posts 101, 102 into openings similar to the openings 107, 108 of the SHOP Block 100. The SHOP Block 100 will not stack properly without the wire leads 501, 502 installed to produce the assembled SHOP Block 200. The wire leads 501, 502 provide the interference fit for proper mechanical stacking with, for example, other SHOP Blocks, SHOPX Blocks or other components.

Figure 3:
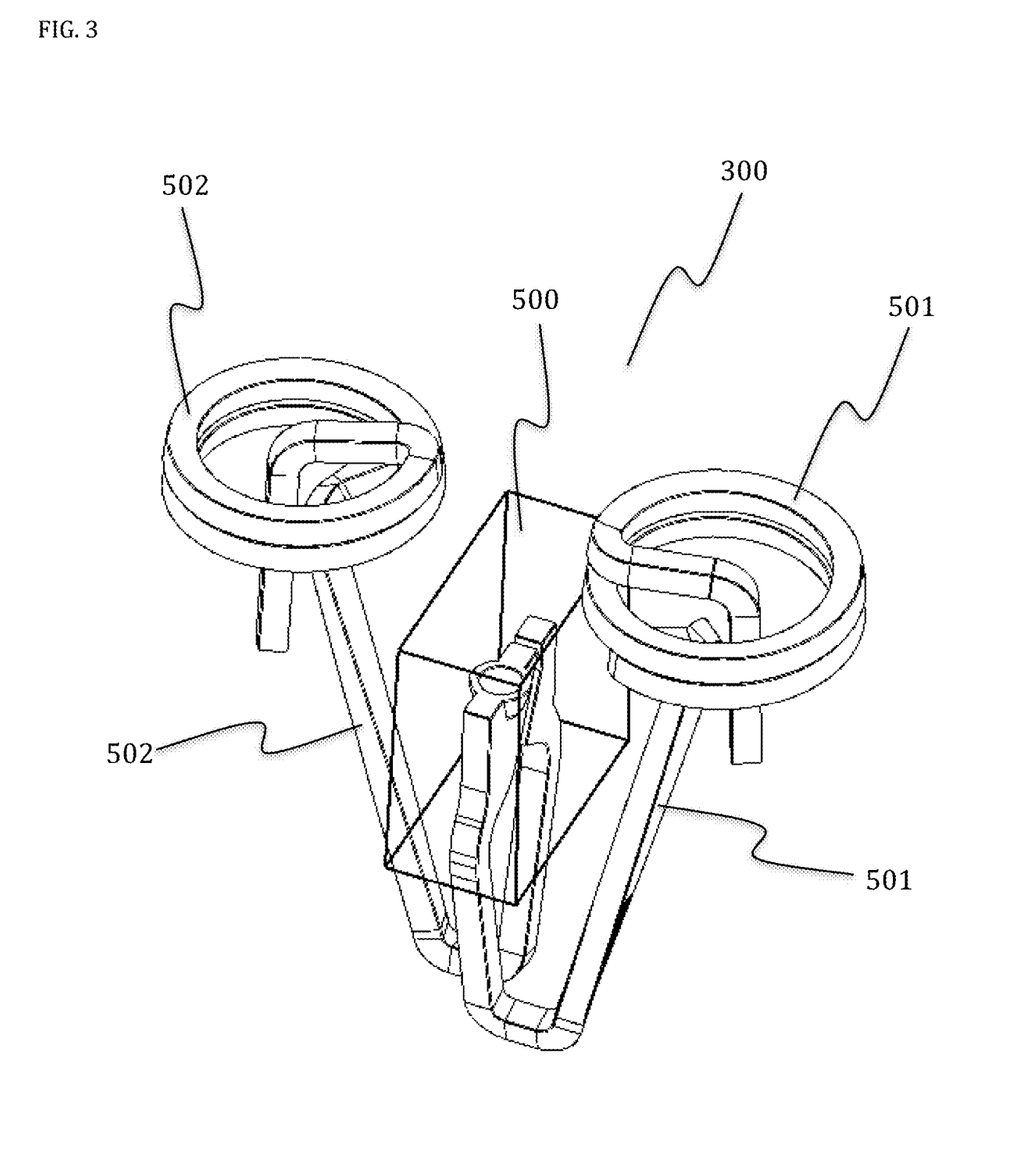
FIG. 3 shows formation of the LED 500 leads 501, 502 after installation within the interior of a SHOP Block of the present system.

FIG. 3 shows a perspective view 300 of the LED 500 wire leads 501, 502 after installation of the wire leads 501, 502 into the interior of the SHOP Block 100, but with the SHOP Block 100 removed for illustrative purposes and clarity. The wire leads 501, 502 may be from any electronic component that fits into opening 103 and has wire leads close to the same diameter. A typical LED 500 may have square wire leads 501, 502, but round wire leads on other electronic components will also produce the interference fit required for mechanical stacking.

Figure 4:
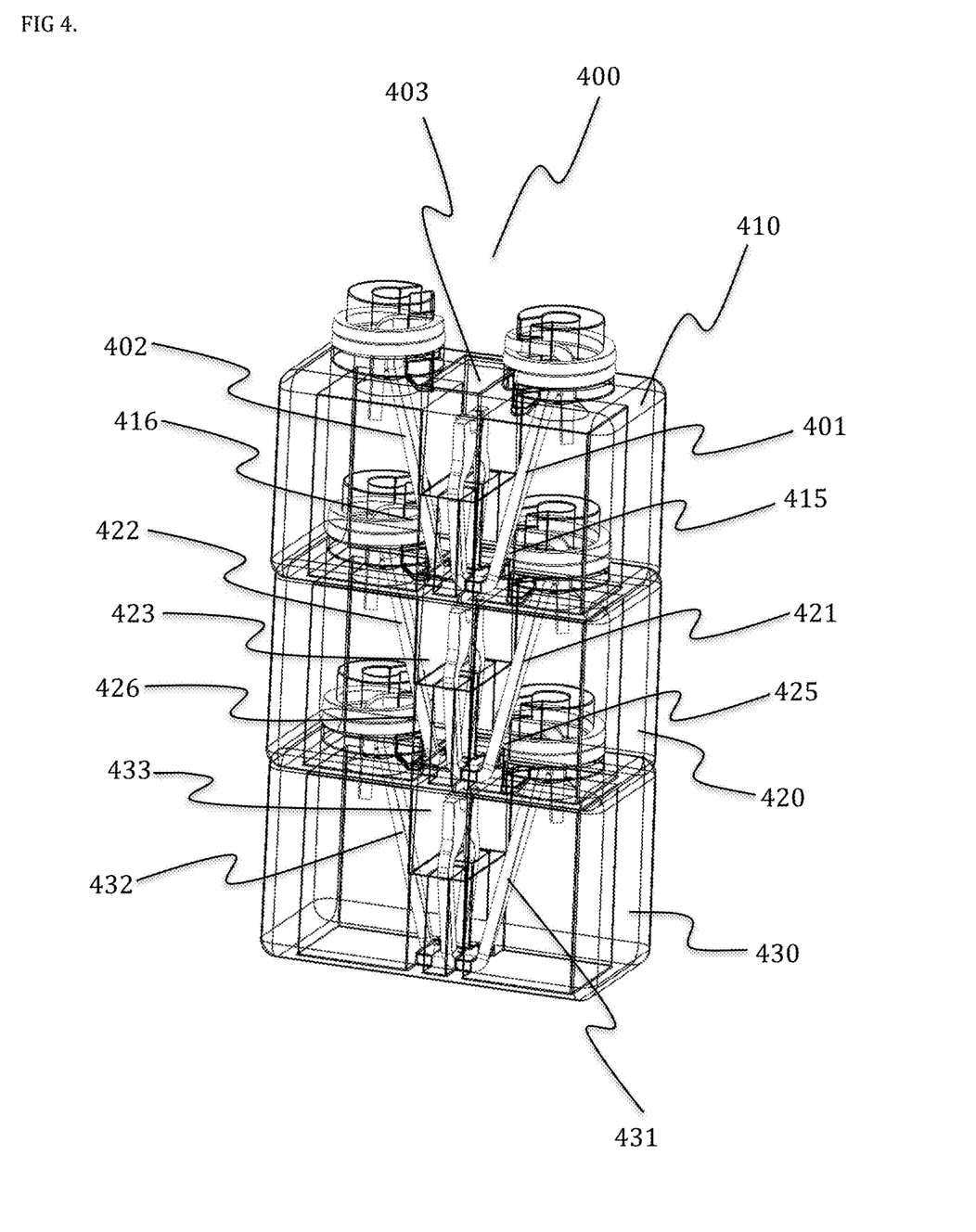
FIG. 4 illustrates a vertical electronic connection in vertically stacked SHOP Blocks 200.

FIG. 4 shows a perspective view 400 of three different SHOP Blocks 410, 420, 430 each containing an electronic LED 500 in a vertical stack in one embodiment. The right LED wire lead 401 in SHOP Block 410 may make an electrical contact with the right LED wire lead 421 in SHOP Block 420 at point 415. The right LED wire lead 421 may make an electrical contact with the right LED wire lead 431 in SHOP Blocks 430 at point 425. As a result, all the right LED wire leads 401, 421, 431 may be electronically connected in the stack.

In the same manner, the left LED wire lead 402 in SHOP Block 410 may make an electrical contact with the left LED wire lead 422 in SHOP Block 420 at point 416. The left LED wire lead 422 may make an electrical contact with the left LED wire lead 432 in SHOP Block 430 at point 426. As a result, all the left LED wire leads 402, 422, 432 may be electronically connected in the stack. Because all the right LED wire leads 401, 421, 431 are electronically connected and all the left LED wire leads 402, 422, 432 are electronically connected, all three of the LEDs 403, 423, 433 are electronically in a parallel connection. Any other electronic component with radial or formed radial wire leads of sufficient length to properly fit in the SHOP Block 100 and placed in the stack 400 would also become electronically in parallel with all other components in the stack 400.

Figure 5:
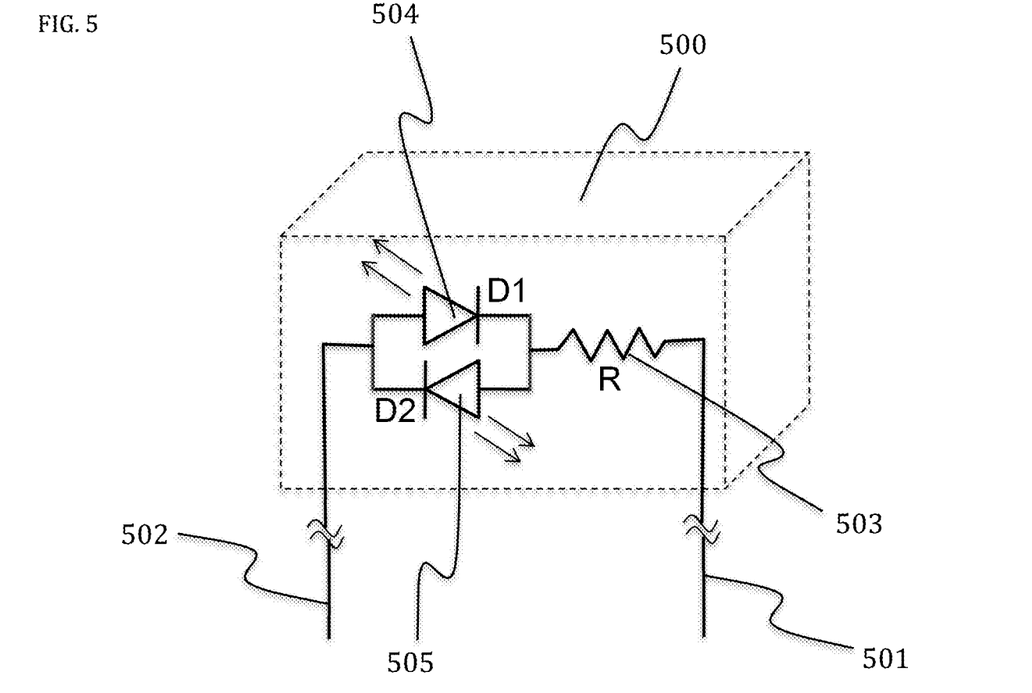
FIG. 5 is an illustration of a bi-directional, two-color LED 500 circuit with long leads 501 and the electronic schematic 502 of the LED 500 parts inside.

FIG. 5 illustrates an embodiment of the device wherein the LED 500 may contain a resistor R 503 and two light emitting diodes D1 504 and D2 505 to produce light of the same or different colors when the voltage across the leads 501, 502 is reversed. This type of electronic device is called non-polarized and will function even when voltage is reversed. Examples of naturally non-polarized electronic components are resistors, disc capacitors, filament lights, inductors, fuses, switches, crystals, electronic audio speakers, DC motors, and wires, just to name a few. Electronic components that need to be installed with the positive voltage on the proper wire lead are called polarized. Polarized electronic components usually are marked to show how the voltage must be connected. Polarized electronic components may not function if the voltage across their wire leads is reversed. The diodes D1 504 and D2 505 in LED 500 are polarized components, but when placed in opposite parallel connection as shown in FIG. 5, one of the diodes D1 504 or D2 505 will receive the proper voltage to function. This makes the SHOP Block 200 a non-polarized device.

Figure 6:
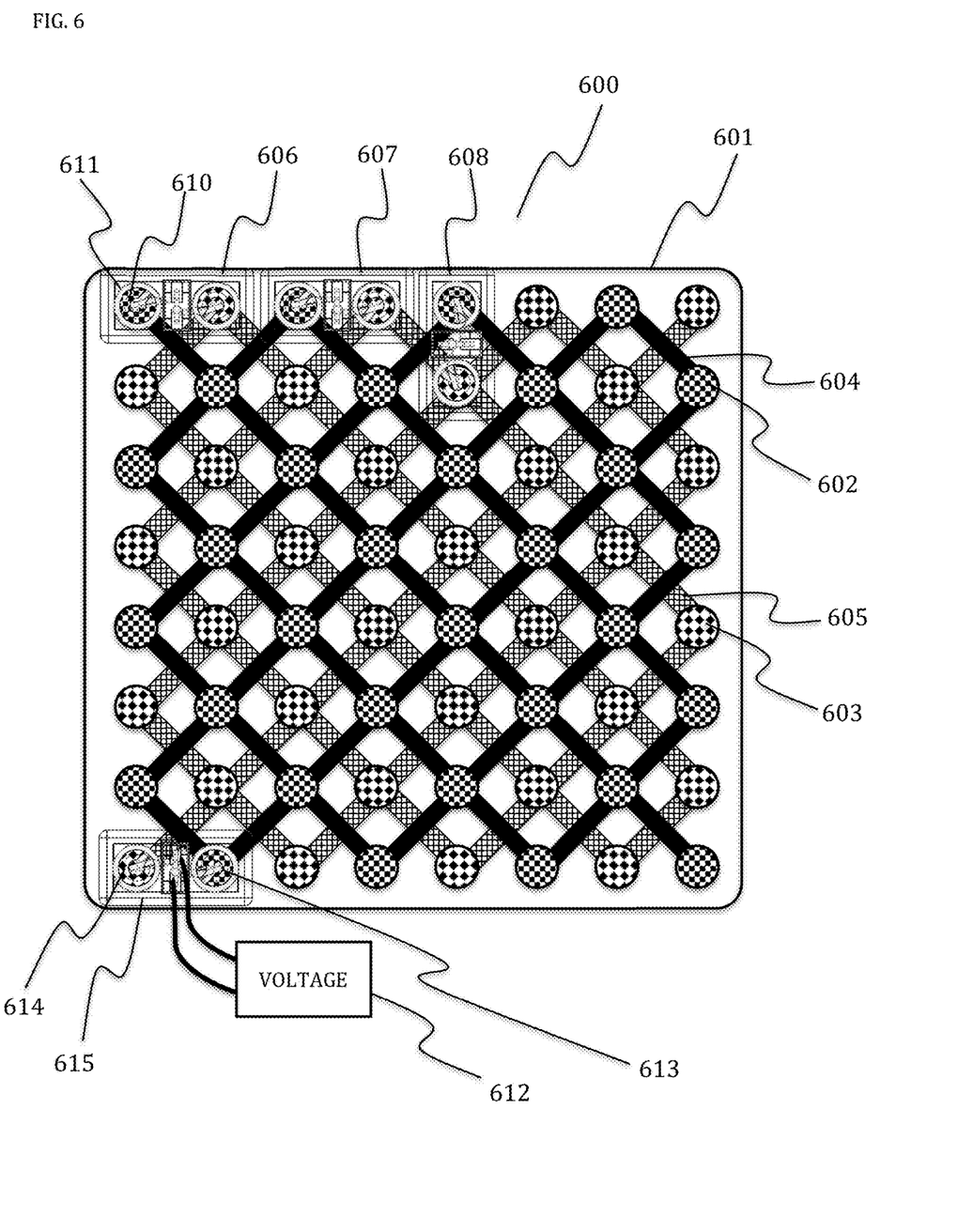
FIG. 6 illustrates an optional base grid 600 to provide voltage for the bottoms 106 of SHOP Blocks 200.

FIG. 6 shows a top view 600 of a printed circuit board 601 with conductive screw heads 602, 603 mechanically and electronically fastened through plated through holes in the printed circuit board 601 in one embodiment of the present system. The top copper plating 604 on the printed circuit board 601 may electronically connect all the conductive screws 602, marked with small squares only to distinguish them in the drawing. The bottom copper plating 605 on the printed circuit board 601 electronically connects all the conductive screws 603, marked with small diamonds only to distinguish them in the drawing. In an embodiment, each square-marked screw 602 may be electronically connected to every other square-marked screw 602 and surrounded by only diamond-marked screws 603 at the proper distance to enter the bottom openings 107, 108 of the SHOP Block 200. Also, each diamond-marked screw 603 is electronically connected to every other diamond-marked screw 603 and surrounded by only square-marked screws 602 at the proper distance to enter the bottom openings 107, 108 of the SHOP Block 200. In this manner, any SHOP Block 200 containing a properly installed electronic component and placed on the printed circuit board 601 will be electronically in parallel with all other similar SHOP Blocks 200 on the printed circuit board 601.

FIG. 6 also illustrates three top views 606, 607, 608 of SHOP Blocks 200 with the LED 500 properly mounted in each. Shown in the top view 600, the screw head 610 is the exact diameter of the top post 101 with a wire lead wrapped around 611. This provides a mechanically tight and removable fit of the SHOP Block 606 with LED 500 inside while also making an electronic connection to the LED wire lead 502 in the SHOP Block 606. This is also true for all the screws 602, 603 upon which SHOP Blocks 606, 607, 608 are installed. When a SHOP Block 100 is used as a plug 615, it may provide a voltage 612 to be applied between any two adjacent screws, such as screw 613 and screw 614. Thereafter, the same voltage 612 will appear between all adjacent screws on the printed circuit board 601.

Figures 7, 7A:
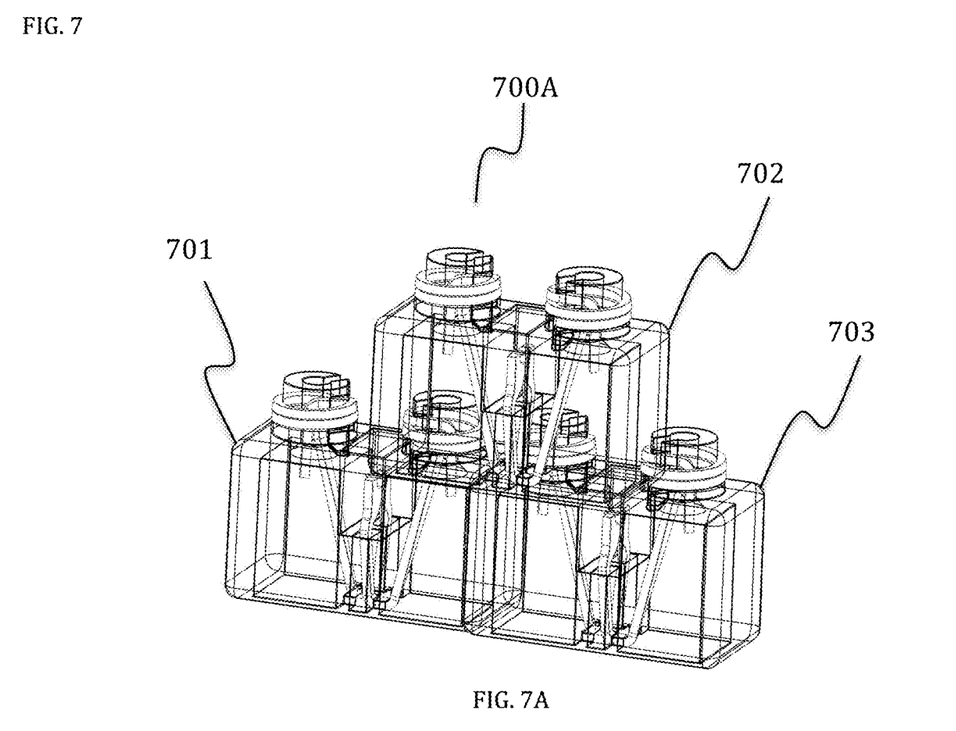
FIG. 7A illustrates a perspective view 700 of how SHOP Blocks 200 can be connected to make a series electronic circuit.
Figure 7B:
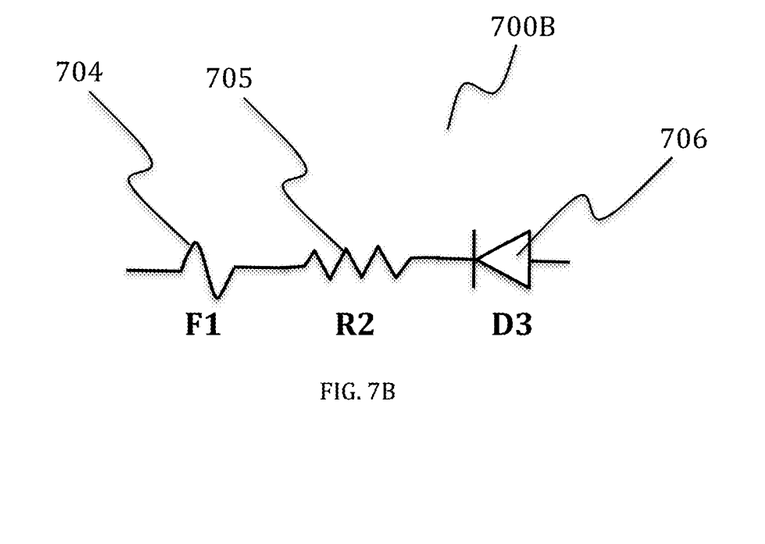
FIG. 7B illustrates the electrical circuit path showing a fuse F1 704, a resistor R2 705, and a diode D3 706 connected in series.

FIG. 7 illustrates a perspective view 700A of how three (3) SHOP Blocks 701, 702, 703 may be connected in a staggered manner in order to make the series electronic circuit 700B. SHOP Block 701 may have a thermal fuse resistor F1 704 located within its interior 113. The SHOP Block 702 may have a standard resistor R2 705 located within its interior 113. The SHOP Block 703 may have a standard LED diode D3 706 located within its interior 113. Stacking SHOP Blocks 701, 702, 703 in a staggered manner as shown in view 700A will produce the simple series electronic circuit shown in view 700B.

Figure 8:
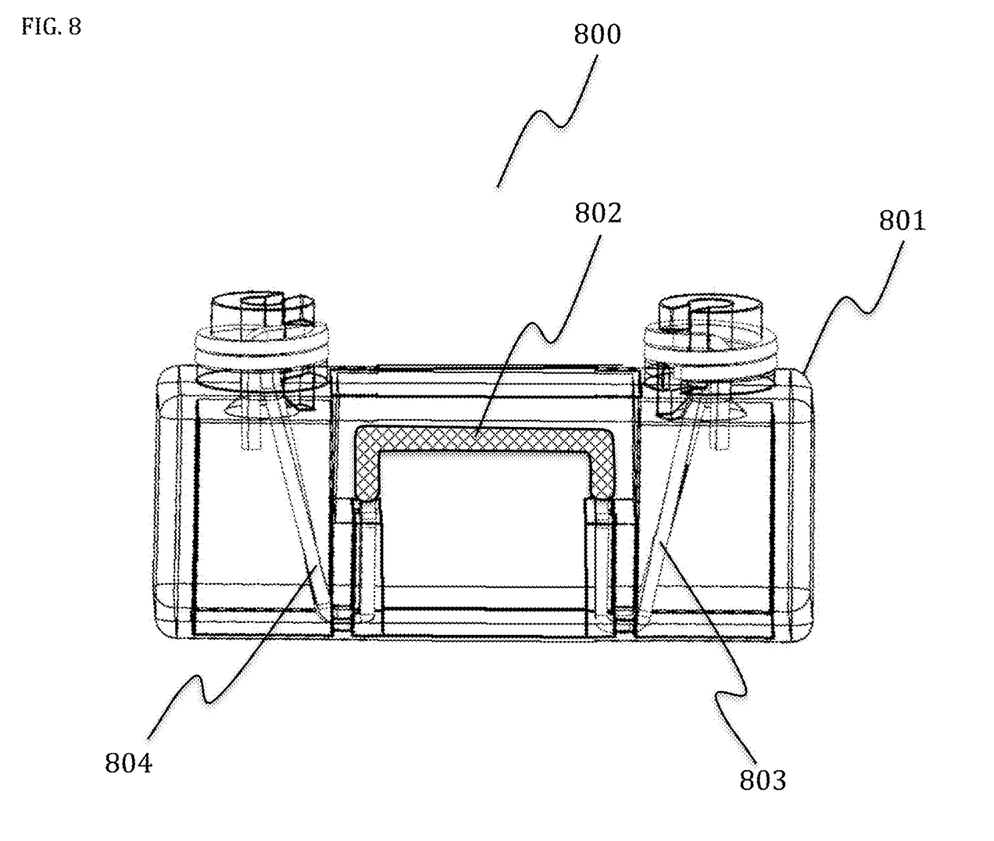
FIG. 8 illustrates a side view 800 showing the interior of a SHOP Block 200 and wires 801 in one embodiment wherein the length of the SHOP BLOCK is expanded.

FIG. 8 illustrates a perspective view 800 of a SHOP Block 801 which has been increased in length from SHOP Block 100 by 50% to hold an insulated wire 802. The right end of the wire 802 has been stripped of insulation exposing only bare wire 803 and the left end of the wire 802 has been stripped of insulation exposing only bare wire 804. The bare wire ends 803, 804 of the wire 802 are then installed into SHOP Block 801 as described in FIG. 1. Due to the added length of SHOP Block 801, it will not produce a short of the voltage 612 if installed on printed circuit board 601 because it only fits onto screws at the same voltage.

Figure 9:
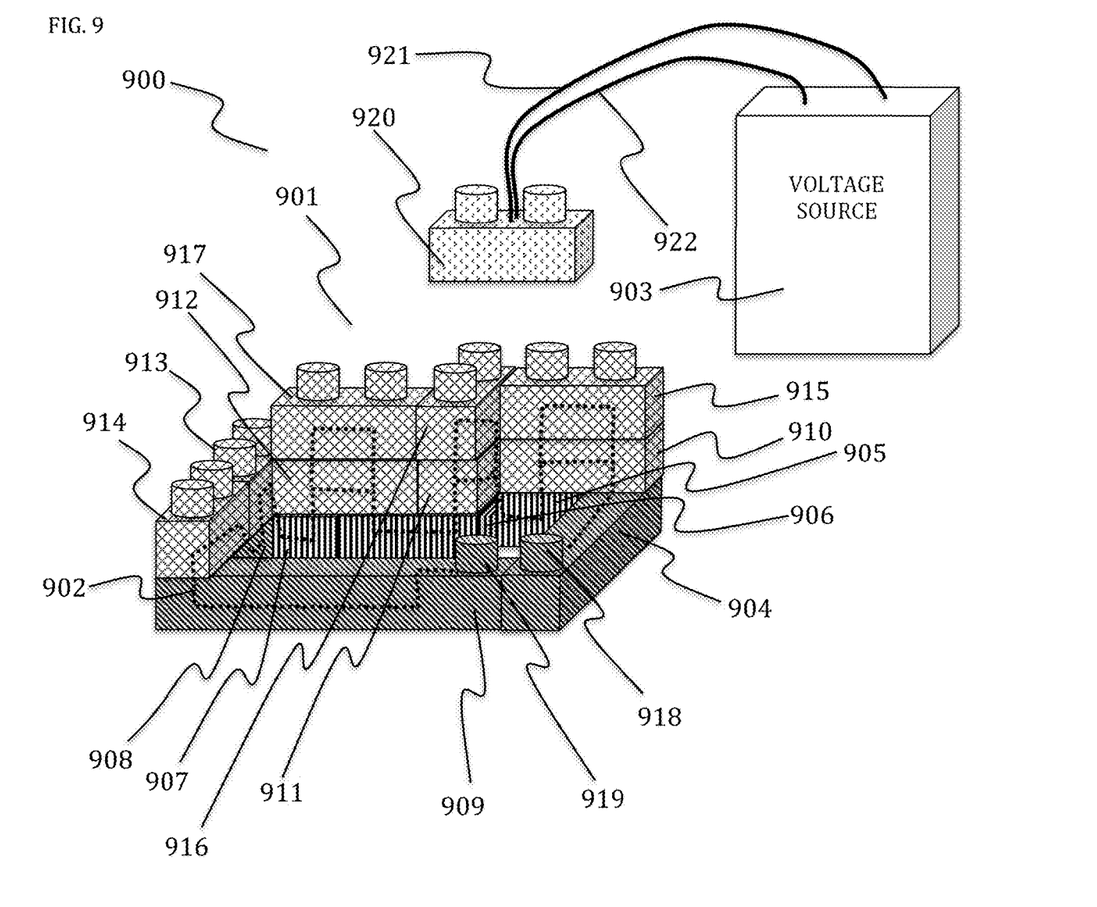
FIG. 9 illustrates a perspective view 900 of how SHOP Blocks 200 alone can build three-dimensional structures 901 that contain series and parallel paths for current 902 from an outside voltage source 903.

FIG. 9 illustrates a perspective view 900 of how SHOP Blocks 200 alone may build a three-dimensional structure 901 which contains both series and parallel paths for current 902 from an outside voltage source 903. The bottom level of the structure 901 may contain SHOP Blocks 200 with wires and SHOP Blocks 800 that have been increased in length by, for example, two and a half times the normal length of a SHOP Block 200.

The SHOP Blocks 904-909 containing wires are shaded darker for clarity and are the bottom level of the structure 901. The second level of the structure 901 uses SHOP Blocks 910-914 that are the same as SHOP Block 200 with an LED 500 inside. The top level of the structure 901 uses SHOP Blocks 910-914 that are the same as SHOP Block 200 with an LED 500 inside. The structure 901 provides a conductive circuit path 902 with one path end at post 918 and the other path end at post 919. When SHOP Block 920, acting as a plug, is pressed down onto terminals 918, 920, the voltage source 903 will produce a flow of electricity through wires 921, 922 and circuit path 902. SHOP Block 917 and SHOP Block 912 are electronically in parallel because they are stacked directly and not staggered. SHOP Block 916 and SHOP Block 911 are electronically in parallel because they are stacked directly and not staggered. SHOP Block 915 and SHOP Block 910 are electronically in parallel because they are stacked directly and not staggered. This produces three parallel stacks of SHOP Blocks in the vertical structure 901. SHOP Blocks 907-909, 913, and 914 are staggered from one to another and therefore produce a series electronic connection. The remaining SHOP Blocks 904-906 are staggered to connect the three parallel stacks in an electronic series connection.

In this vertical structure 901 containing series and parallel electronic circuits, all electronic connections are made by the wire leads of the electronic components in the SHOP Block housing 100 without the use of any other electronic connection method such as soldering or added clips or springs. Even the voltage is brought to the vertical structure 901 via a SHOP Block 920 used as an electronic plug.

Figure 10:
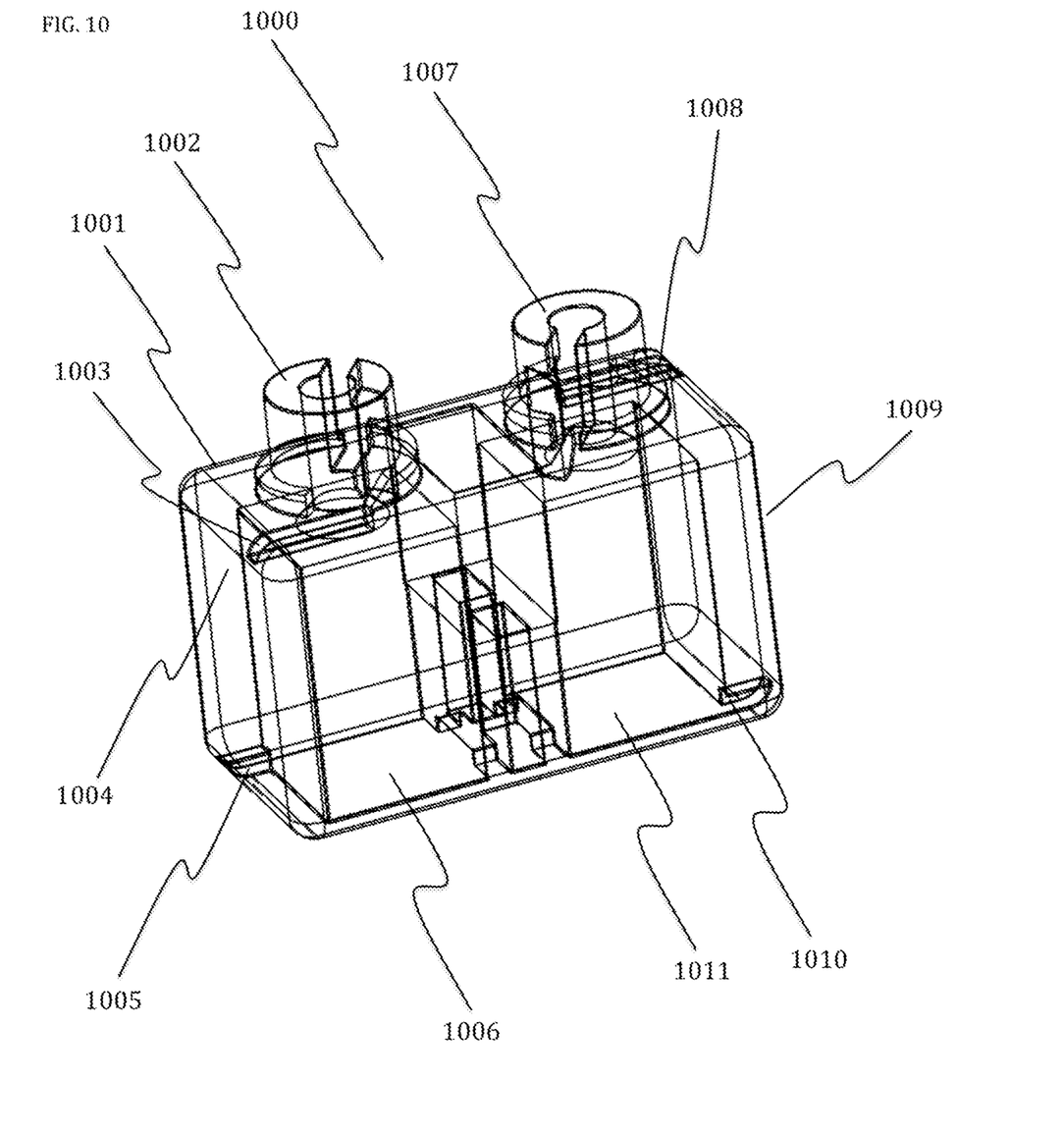
FIG. 10 shows how a side connection could be added by extending the electronic component lead length and forming it to provide a contact wire on the side of the SHOP Block 950.

FIG. 10 is a perspective view 1000 of a modified SHOP Block 100 housing (hereafter SHOPX Block housing 1001) wherein the modified SHOPX Block allows the wire leads from electronic components to also provide a left side and right side contact in addition to the top and bottom contacts in SHOP Block 200. The left wire lead 1101 from the electronic component is wrapped around the left top post 1002 in a clockwise downward manner and forced into the groove 1003 on the top of the SHOPX Block housing 1001. The left wire lead 1101 is then brought down the left side 1004 of SHOPX Block housing 1001 and pressed into bottom groove 1005 through hole 1006 and back up into the SHOPX Block housing 1001. The right wire lead 1102 from the electronic component is wrapped around the right top post 1007 in a clockwise downward manner and forced into the groove 1008 on the top of the SHOPX Block housing 1001. The right wire lead 1102 is then brought down the right side 1009 of SHOPX Block housing 1001 and pressed into bottom groove 1010 through hole 1011 and back up into the SHOPX Block housing 1001.

Figure 11:
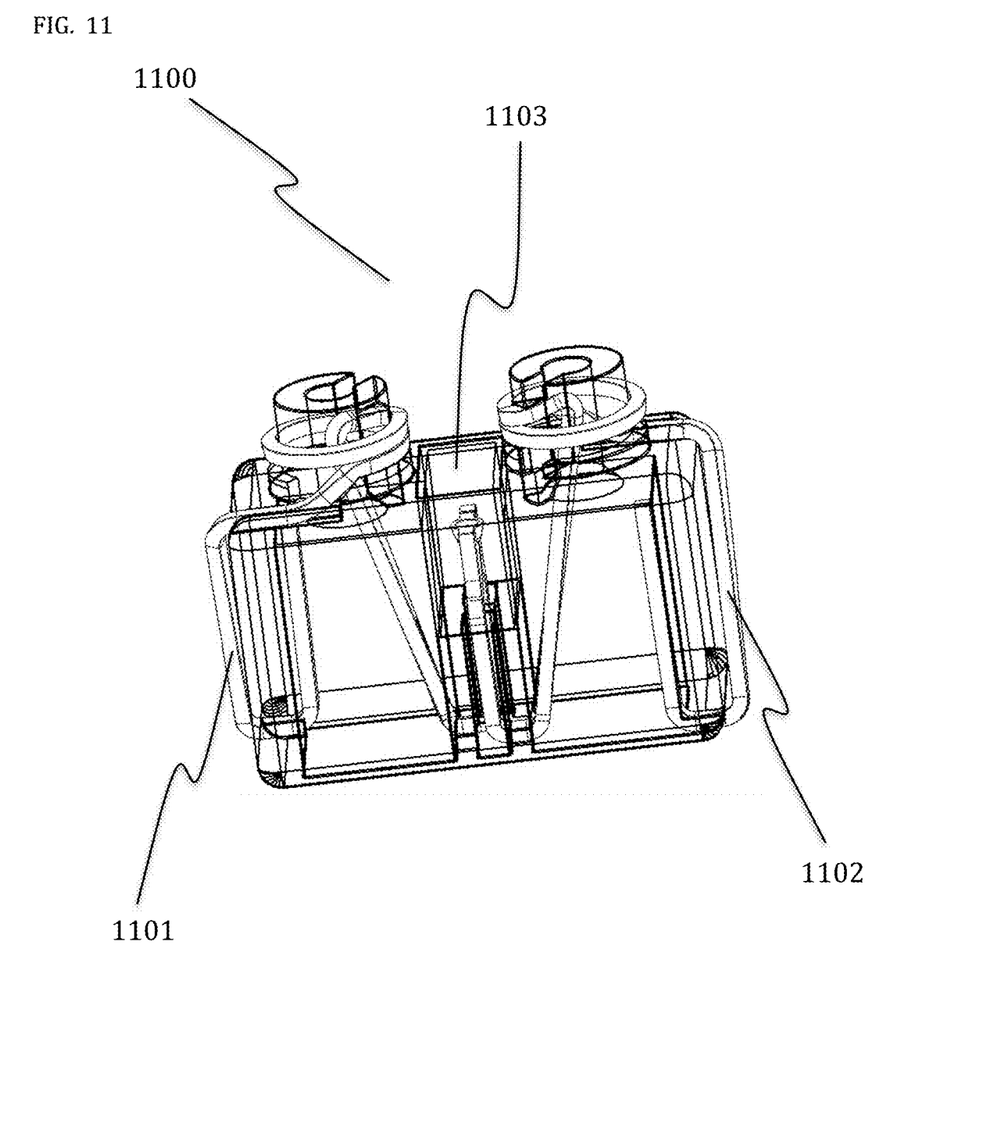
FIG. 11 is a perspective view 1100 of a working SHOPX Block housing 1001 with a properly installed electronic component.

FIG. 11 is a perspective view 1100 of a SHOPX Block housing 1001 showing a properly installed left side electronic component 1103 wire lead 1101 and a properly installed right side electronic component 1103 wire lead 1102.

Figure 12:
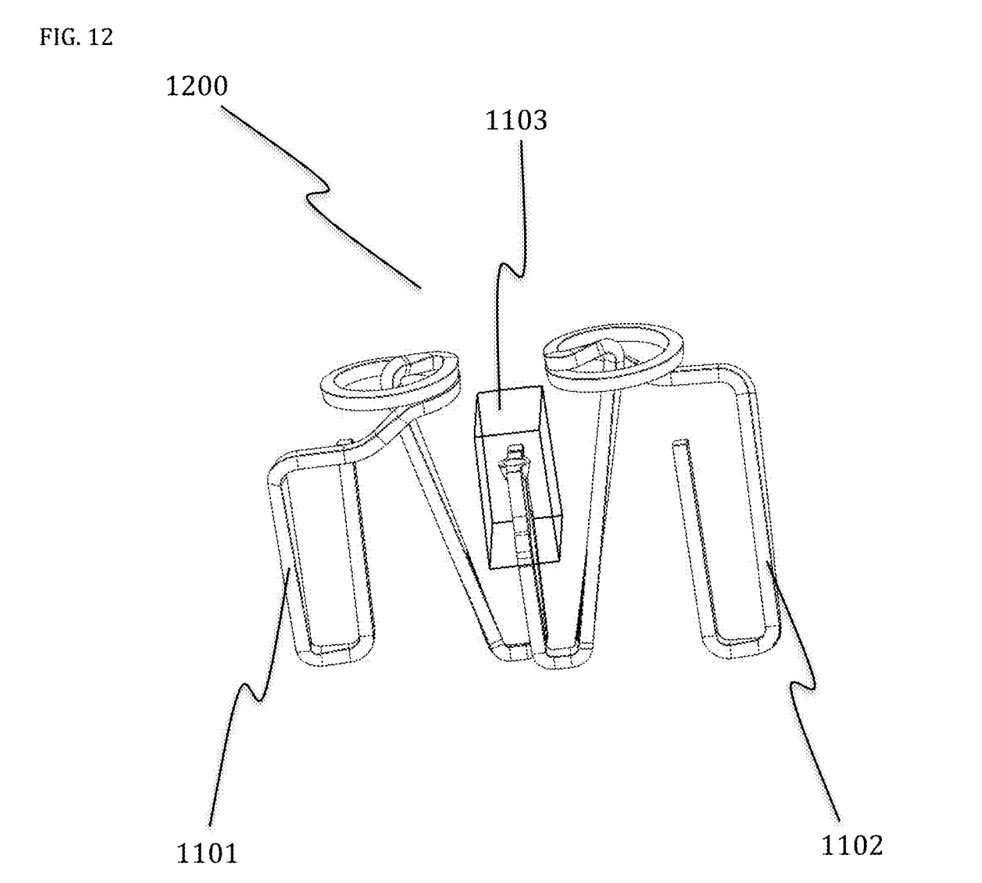
FIG. 12 is a perspective view 1200 of the wires of a properly installed electronic component 1103 inside a SHOPX Block 1001.

FIG. 12 is a perspective view 1200 of a properly installed electronic component 1103 left side wire lead 1101 and a properly installed electronic component 1103 right side wire lead 1102 with the SHOPX Block housing 1001 removed for clarity.

Figure 13:
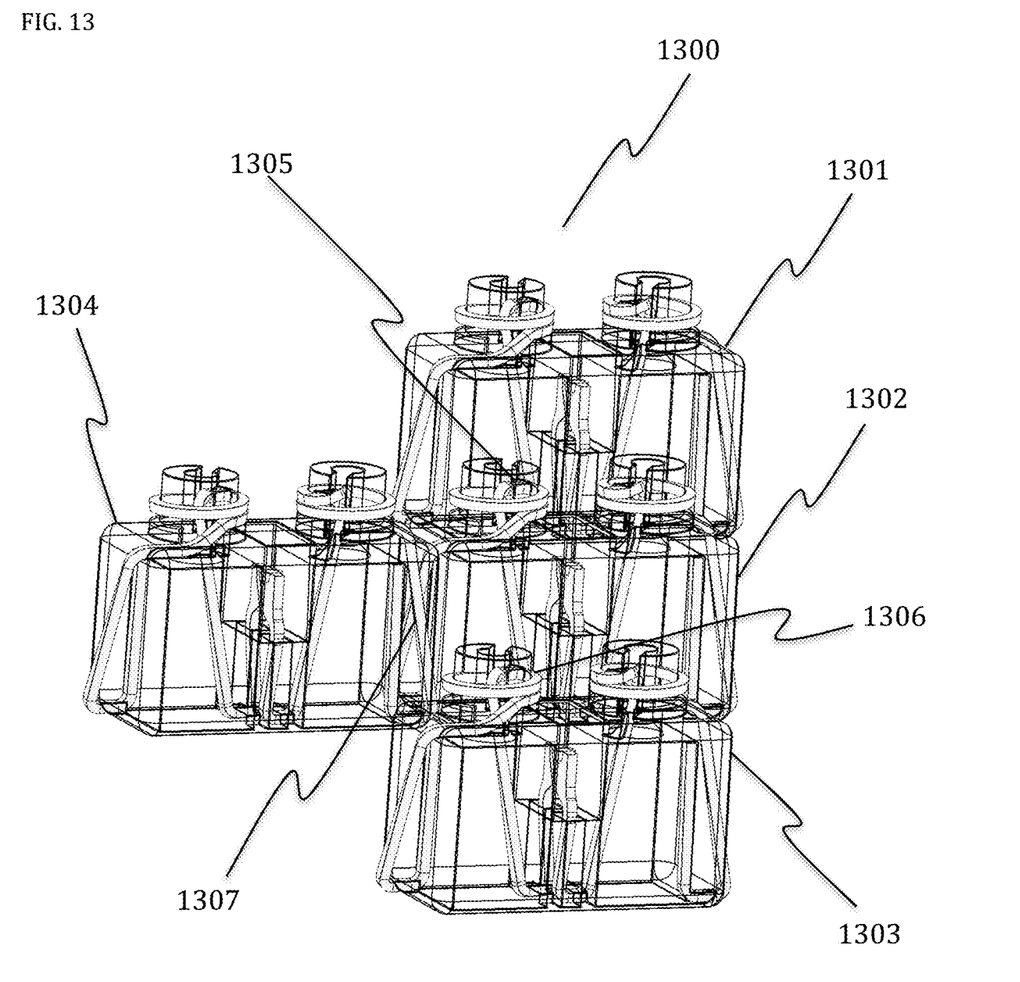
FIG. 13 is a perspective view 1300 of four 4 SHOPX Blocks 1301-1304 that may be position in a three-dimensional structure 901.

FIG. 13 is a perspective view 1300 of four (4) SHOPX Blocks 1301-1304 that may be positioned in a three-dimensional structure 901 similar to the one shown in FIG. 9. The left post of SHOPX Block 1301 is connected to the left post of SHOPX Block 1302 at contact point 1305. The left post of SHOPX Block 1302 is connected to the left post of SHOPX Block 1303 at contact point 1306. The right post of SHOPX Block 1304 is connected to the left post of SHOPX Block 1302 at contact point 1307. The connection point 1307 is made by the pressure of the right wire lead 1102 in SHOPX Block 1304 against the left wire lead 1101 in SHOPX Block 1302 when they cross.

Figure 14:
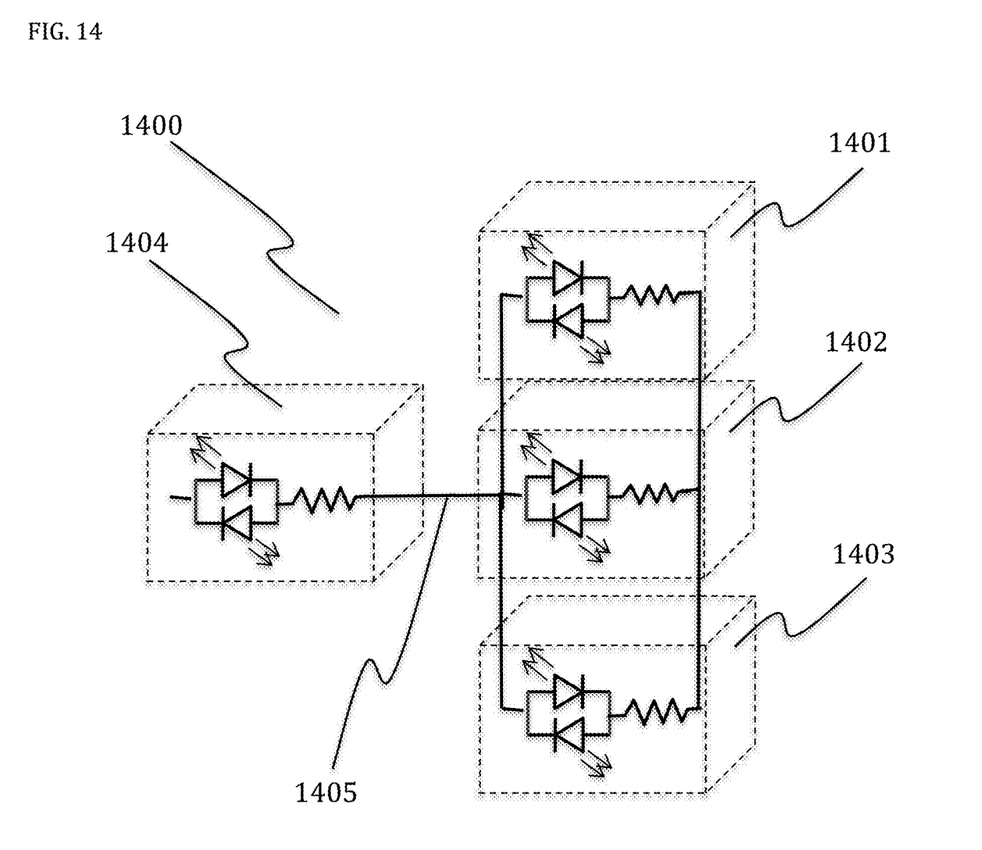
FIG. 14 is an electronic schematic drawing 1400 of all the SHOPX Blocks 1301-1304 containing a non-polarized LED 500.

FIG. 14 is an electronic schematic drawing 1400 of all the SHOPX Blocks 1301-1304 containing non-polarized LEDs 1401-1404 similar to the non-polarized LED 500 shown in FIG. 5. SHOPX Blocks 1401-1403 are electronically in parallel because they are stacked directly and not staggered. SHOPX Block 1404 is in series with this parallel stack via the connection 1405 produced when the left side of SHOPX Block 1402 is pressed against the right side of SHOPX Block 1404 and shown also as connection point 1307 in the perspective view 1300 in FIG. 13. The electronic circuit 1400 illustrated in FIG. 14 contains both series and parallel electronic connections without the use of any other blocks containing wires or any other electronic components.

Although SHOP Block 100 and SHOPX Block 1001 housings have been shown using shapes similar to blocks, or bricks, these housings are not limited to this shape and could also have T-shaped, square, or rectangular shapes, just to name a few, and contain electronic components with more than two leads and even circuit boards with many leads. Accordingly, although the invention has been described by reference to a preferred embodiment, it is not intended that the novel electro-mechanical assembly be limited thereby, but that modifications thereof are intended to be included as falling within the broad scope and spirit of the forgoing disclosure, the following claims and the appended drawings.

We claim:

1. An electro-mechanical block housing system comprising:
    a first housing having a top, a bottom, a front, a back, a first side, a second side and an interior;
    at least one opening and at least a first post located on the top of the housing;
    an electrical wire inserted within the interior of the housing wherein the electrical wire at least partially wraps around the first post at the top of the housing;
    wherein the first post of the housing may mechanically connect with an opening at the bottom of a second housing; and
    wherein the electrical wire of the first housing may make electrical contact with a second wire of the second housing.

2. The electro-mechanical block housing system of claim 1 wherein the electrical wire may be a fusing wire which is activated if electrical current passing through the fuse exceeds a specified amount.

3. The electro-mechanical block housing system of claim 1 wherein the bottom of the housing is mostly open.

4. An electro-mechanical block housing system comprising:
    a first housing having a top, a bottom, a front, a back, a first side, a second side and an interior;
    at least two openings and at least a first post and a second post located on the top of the housing;
    a first electrical wire and a second electrical wire inserted within the interior of the first housing wherein the first electrical wire at least partially wraps around the first post;
    wherein the second electrical wire at least partially wraps around the second post;
    wherein the first post and the second post mechanically of the first housing connect with openings at the bottom of a second housing; and
    wherein the first electrical wire and the second electrical wire may electrically be connected to the second housing.

5. The electro-mechanical block housing system of claim 4 wherein the first electrical wire and or the second electrical wire may include a light emitting diode, a standard electronic diode, a Zener diode, a diac diode, a crystal, an electronic resistor, an electronic capacitor, an inductor, a thermal fuse, an optical sensor, a magnetic sensor, an electromagnet, a battery, an antenna, an electronic sound producing buzzer, an electronic speaker, a microphone, a series resonant electronic filter, or a parallel resonant electronic filter.

6. The electro-mechanical block housing system of claim 4 wherein the first housing is made of transparent material which allows the transmission of light to pass through the first housing.

7. The electro-mechanical block housing system of claim 4 wherein the first housing is made of florescent material that may continue to glow after light is removed.

8. The electro-mechanical block housing system of claim 4 wherein the first electrical wire and or the second electrical wire are conductive ends of an insulated wire.

9. The electro-mechanical block housing system of claim 4 wherein the first electrical wire of the first housing makes an electrical contact with an electrical wiring of a second housing when an opening of the bottom of the first housing is placed on a first conductive post on the top of the second housing.

10. The electro-mechanical block housing system of claim 9 wherein the first housing may be secured on a grid having a base having many conductive posts and wherein the grid has electrical components which may form an electrical current path between the grid and the first housing.

11. An electro-mechanical block housing system comprising:
    a first housing having a top, a bottom, a front, a back, a first side, a second side and an interior;
    at least two openings and at least a first post and a second post located on the top of the housing;
    a first electrical wire and a second electrical wire inserted within the interior of the first housing wherein the first electrical wire has a terminal end which wraps around the first post and then extends down the first side of the first housing;
    wherein the second electrical wire has a terminal end which wraps around the second post of the first housing and then extends down the second side of the housing;
    wherein the first post and the second post of the housing may mechanically connect with openings at the bottom of a second housing and wherein the first side and the second side of the first housing make electrical contact with a second housing; and wherein the first electrical wire make up to three simultaneous electrical contacts with electrical wires of other housings and the second electrical wire make up to three simultaneous electrical contacts with electrical wires of other housings.

12. The electro-mechanical block housing system of claim 11 wherein the first side or the second side of the first housing may be located in a mechanical structure and make electrical contact to any electrically conductive plated surface.

13. The electro-mechanical block housing system of claim 11 wherein the second electrical wire may make electrical contact with any conductive surface.

14. The electro-mechanical block housing system of claim 11 wherein the first electrical wire and or the second electrical wire may be leads from a light emitting diode, a standard electronic diode, a Zener diode, a diac diode, a crystal, an electronic resistor, an electronic capacitor, an inductor, a thermal fuse, an optical sensor, a magnetic sensor, an electromagnet, a battery, an antenna, an electronic sound producing buzzer, an electronic speaker, a microphone, a series resonant electronic filter, or a parallel resonant electronic filter.

15. The electro-mechanical block housing system of claim 11 wherein the first housing is transparent.

16. The electro-mechanical block housing system of claim 11 wherein the first housing is made of a florescent material.

17. The electro-mechanical block housing system of claim 11 wherein the first electrical wire of the first housing makes an electrical contact with an electrical wiring of a second housing when an opening of the bottom of the first housing is placed on a first conductive post on the top of the second housing.

* * * * *